(12) United States Patent
Egawa

(10) Patent No.: US 10,863,152 B2
(45) Date of Patent: Dec. 8, 2020

(54) PROJECTOR

(71) Applicant: SEIKO EPSON CORPORATION, Tokyo (JP)

(72) Inventor: Akira Egawa, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/582,480

(22) Filed: Sep. 25, 2019

(65) Prior Publication Data

US 2020/0099902 A1    Mar. 26, 2020

(30) Foreign Application Priority Data

Sep. 26, 2018  (JP) ................................ 2018-180117

(51) Int. Cl.
| | | |
|---|---|---|
| *G03B 21/14* | (2006.01) | |
| *H04N 9/31* | (2006.01) | |
| *G03B 17/55* | (2006.01) | |
| *H05K 7/20* | (2006.01) | |
| *H04N 5/225* | (2006.01) | |
| *G03B 21/20* | (2006.01) | |

(52) U.S. Cl.
CPC .......... *H04N 9/3144* (2013.01); *G03B 17/55* (2013.01); *G03B 21/204* (2013.01); *G03B 21/2013* (2013.01); *G03B 21/2033* (2013.01); *H04N 5/2252* (2013.01); *H05K 7/20409* (2013.01)

(58) Field of Classification Search
CPC ................ G03B 21/14; G03B 21/2013; G03B 21/2033; G03B 21/204; H04N 9/31; H04N 9/3144; H04N 9/3164; H04N 9/3161; H04N 7/20409
USPC .................................................... 362/249.02
See application file for complete search history.

(56) References Cited

U.S. PATENT DOCUMENTS

| | | | |
|---|---|---|---|
| 2012/0299801 A1* | 11/2012 | Kitano | H05B 45/00 345/32 |
| 2015/0055667 A1 | 2/2015 | Horn et al. | |
| 2016/0341395 A1 | 11/2016 | Kiyota et al. | |
| 2018/0149953 A1* | 5/2018 | Nomoto | G03B 21/2033 |
| 2019/0310411 A1* | 10/2019 | Hartwig | G02B 6/0025 |

FOREIGN PATENT DOCUMENTS

| | | |
|---|---|---|
| JP | 2011-077155 A | 4/2011 |
| JP | 2016-518726 A | 6/2016 |
| JP | 2016-219779 A | 12/2016 |

\* cited by examiner

*Primary Examiner* — William C. Dowling
(74) *Attorney, Agent, or Firm* — Dority & Manning, P.A.

(57) ABSTRACT

A projector includes a light source apparatus, light modulator, projection optical apparatus, exterior enclosure, and heat sink. The light source apparatus includes a substrate having first and second substrate surfaces, light emitters at the side facing the first substrate surface, a frame at the side facing the first substrate surface surrounding the light emitters, and a lid facing the first substrate surface. The light emitters are in an accommodation space formed by the substrate, frame, and lid. The exterior enclosure has a first surface, a second surface that intersects the first surface, and a third surface that intersects the first and second surfaces, and the area of the first surface is greater than the areas of the second and third surfaces. The first or second substrate surface faces the first surface, and the lengthwise direction of the heat dissipation fin extends along the first surface of the exterior enclosure.

16 Claims, 9 Drawing Sheets

PROJECTOR

The present application is based on, and claims priority from JP Application Serial Number 2018-180117, filed Sep. 26, 2018, the disclosure of which is hereby incorporated by reference herein in its entirety.

BACKGROUND

1. Technical Field

The present disclosure relates to a projector.

2. Related Art

In recent years, to enhance the performance of a projector, attention has been directed to a projector using a laser light source, which is a wide-color-gamut, high-efficiency light source. JP-A-2016-219779 and JP-T-2016-518726 each disclose a light source apparatus in which a plurality of semiconductor light emitters are accommodated in a single package. According to the configuration described above, a compact, high-power light source apparatus can be achieved.

JP-A-2011-77155 discloses a semiconductor light source apparatus including semiconductor light emitters, a heat diffuser, a heat sink, a thermoelectric device, a cooling fan, and a heat insulting air channel and used as a light source of a projector.

The light source apparatuses disclosed in JP-A-2016-219779 and JP-T-2016-518726 each have a problem of an increase in heat density, resulting in a large increase in the temperature of the plurality of semiconductor light emitters and hence a decrease in light emission efficiency thereof although the size of the light source apparatus can be reduced because the semiconductor light emitters are incorporated in a single package. To solve the problem, it is, for example, necessary to sufficiently cool the semiconductor light emitters by using an air-cooling-type cooler, such as the cooler disclosed in JP-A-2011-77155. In the configuration disclosed in JP-A-2011-77155, it is conceivable to increase the size of the heat sink as a component for enhancing the cooling performance.

In the light source apparatus disclosed in JP-A-2011-77155, however, increasing the size of the heat sink undesirably increases the size of the projector although the light source apparatus is compact. It is therefore required to provide a projector including a light source apparatus that has cooling performance capable of sufficiently cooling a light emitter and can contribute to reduction in size of the projector.

SUMMARY

A projector according to an aspect of the present disclosure includes a light source apparatus that outputs light, a light modulator that modulates the light outputted from the light source apparatus in accordance with image information, a projection optical apparatus that projects the light modulated by the light modulator, an exterior enclosure that accommodates the light source apparatus, the light modulator, and the projection optical apparatus, and a heat sink including a heat dissipation fin that dissipates heat in the light source apparatus. The light source apparatus includes a substrate having a first substrate surface and a second substrate surface located at a side opposite the first substrate surface, a plurality of light emitters provided at a side facing the first substrate surface of the substrate, a frame so provided at the side facing the first substrate surface of the substrate as to surround the plurality of light emitters, and a lid including a translucent member that transmits light outputted from the plurality of light emitters, so provided as to face the first substrate surface, and bonded to a side of the frame that is a side opposite the substrate, and the plurality of light emitters are accommodated in an accommodation space formed by the substrate, the frame, and the lid. The exterior enclosure has a first surface, a second surface that intersects the first surface, and a third surface that intersects the first and second surfaces, and an area of the first surface is greater than areas of the second and third surfaces. The first or second substrate surface faces the first surface, and a lengthwise direction of the heat dissipation fin extends along the first surface of the exterior enclosure.

In the projector according to the aspect of the present disclosure, the first or second substrate surface may extend along the first surface.

In the projector according to the aspect of the present disclosure, the exterior enclosure may further have a fourth surface that extends along the first surface of the exterior enclosure and faces the first surface, the light source apparatus may include a first light source apparatus so provided as to face the first surface and a second light source apparatus so provided as to face the fourth surface, and the first light source apparatus may output light toward the fourth surface and the second light source apparatus may output light toward the first surface.

The projector according to the aspect of the present disclosure may further include a fan that produces an air flow that cools the heat dissipation fin.

In the projector according to the aspect of the present disclosure, a rotary shaft of the fan may extend along the first surface of the exterior enclosure.

In the projector according to the aspect of the present disclosure, the second substrate surface of the substrate may intersect the first surface of the exterior enclosure.

In the projector according to the aspect of the present disclosure, a dimension of the heat dissipation fin in a widthwise direction in a downstream portion of the air flow may be greater than a dimension of the heat dissipation fin in the widthwise direction in an upstream portion of the air flow.

DESCRIPTION OF EXEMPLARY EMBODIMENTS

First Embodiment

A first embodiment of the present disclosure will be described below with reference to FIGS. 1 to 5.

Figure 1:
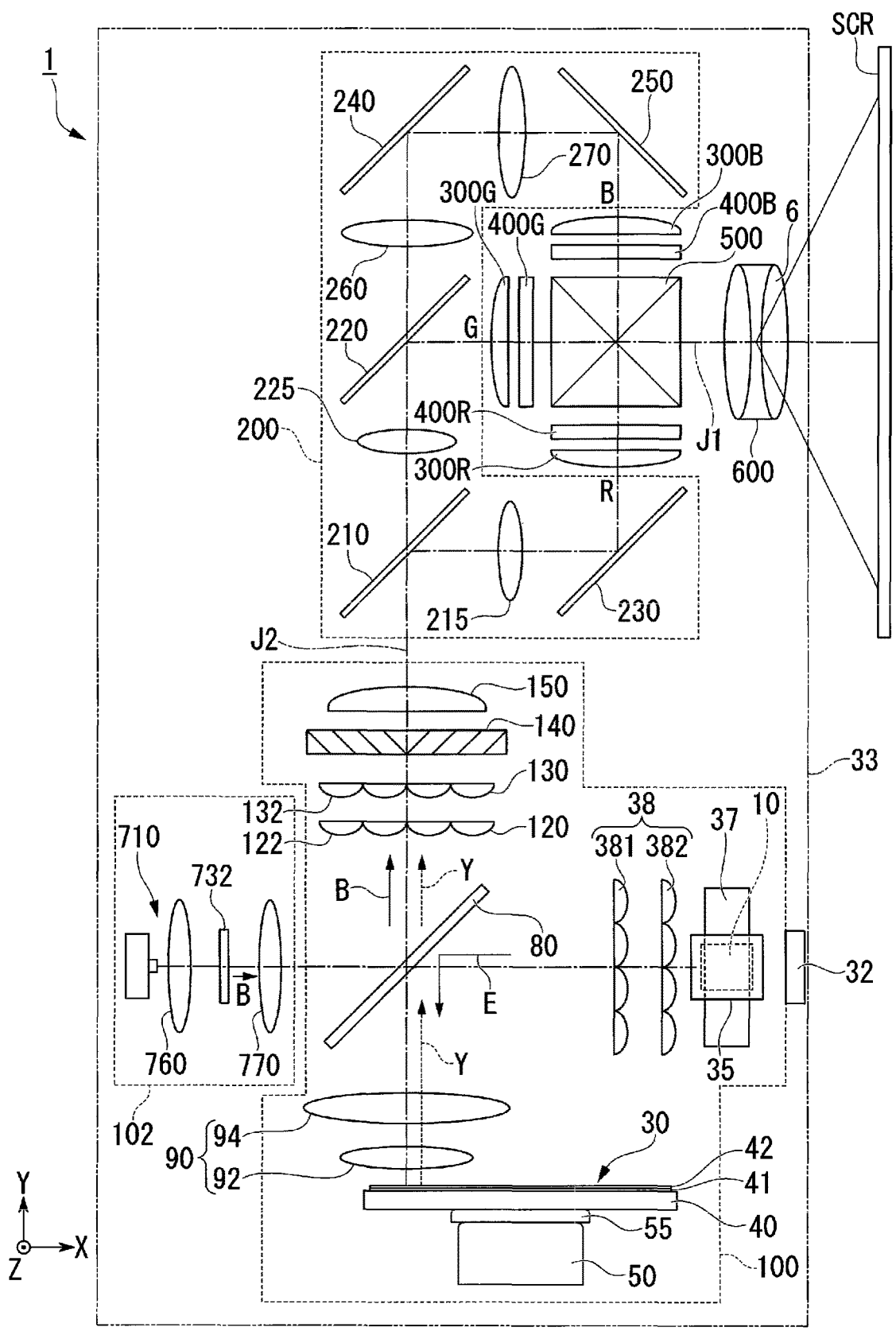
FIG. 1 is a schematic configuration diagram of a projector according to a first embodiment.
Figure 2:
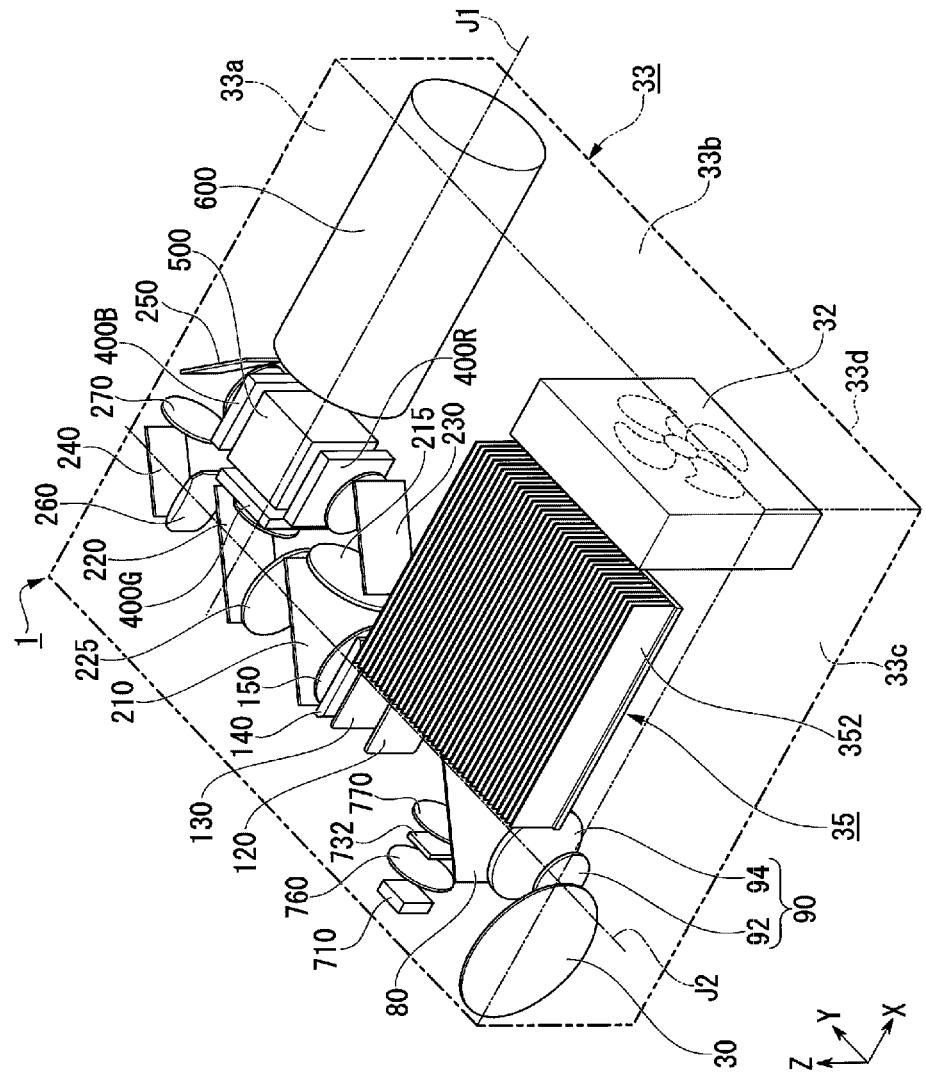
FIG. 2 is a perspective view of the projector.
Figure 3:
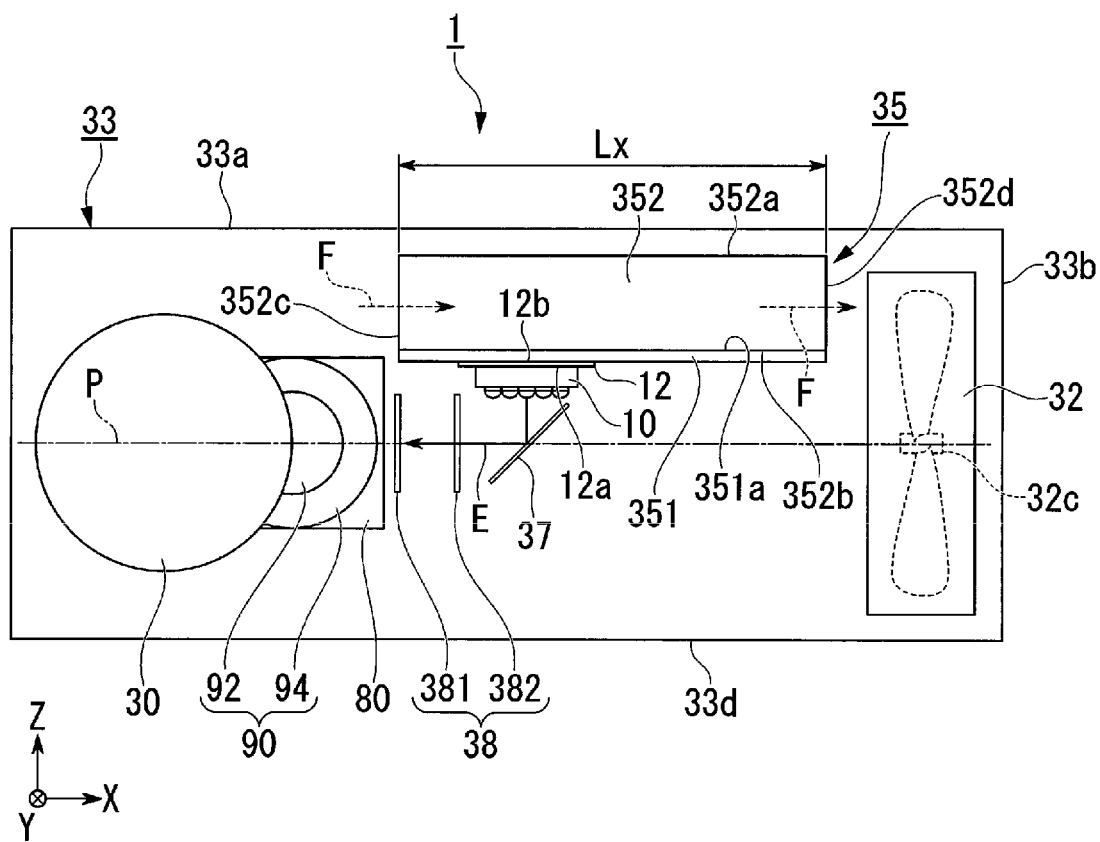
FIG. 3 is a diagrammatic view of the projector viewed through a side surface thereof.
Figure 4:
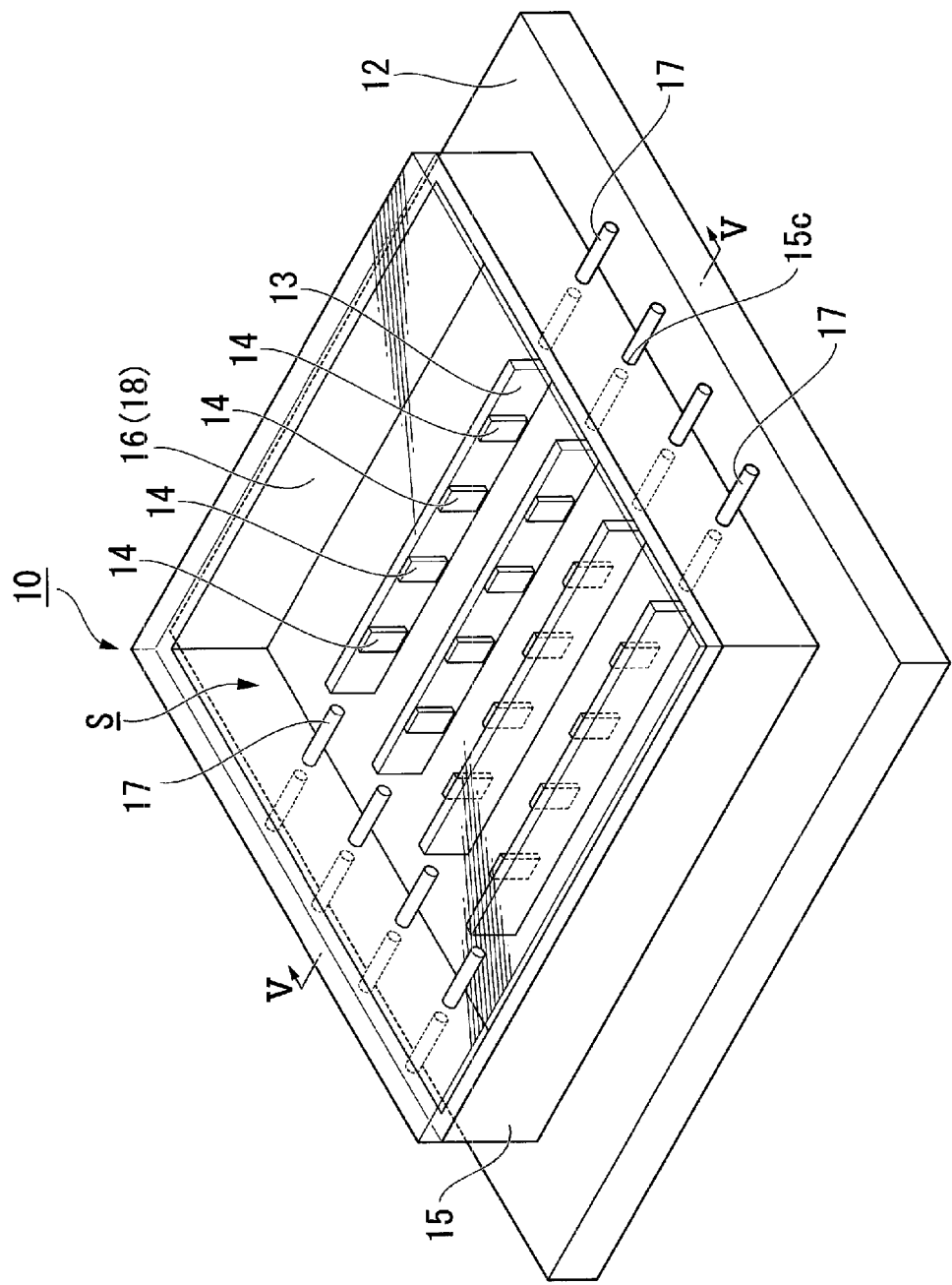
FIG. 4 is a perspective view of a light source apparatus.
Figure 5:
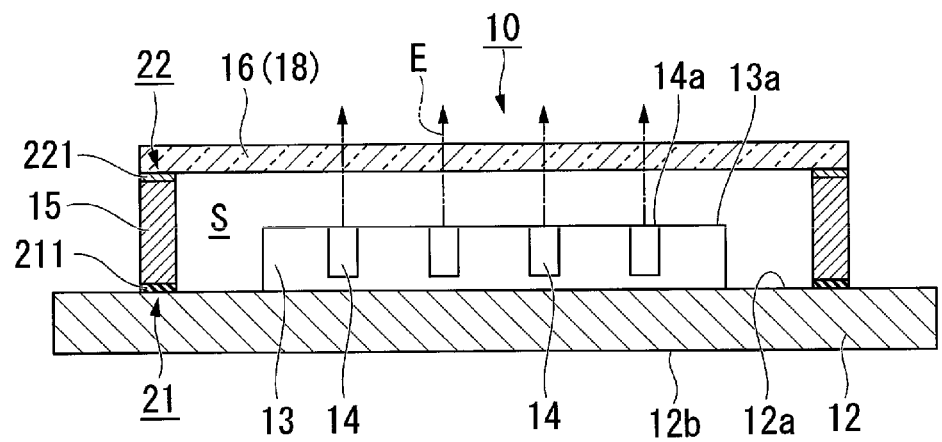
FIG. 5 is a cross-sectional view of the light source apparatus taken along the line V-V in FIG. 4.

FIG. 1 is a schematic configuration diagram of a projector according to a first embodiment. FIG. 2 is a perspective view of the projector. FIG. 3 is a diagrammatic view of the projector viewed through a side surface thereof. FIG. 4 is a perspective view of a light source apparatus. FIG. 5 is a cross-sectional view of the light source apparatus taken along the line V-V in FIG. 4.

In the following entire drawings, each component is drawn in some cases at a different dimensional scale depending on the component for clarity thereof. Further, only minimum components are shown, and the other components are omitted depending on a drawing.

An example of the projector according to the present embodiment will be described.

A projector 1 according to the present embodiment is a projection-type image display apparatus that projects color video images on a screen (projection receiving surface) SCR. The projector 1 includes three liquid crystal light modulators corresponding to the following kinds of color light: red light; green light; and blue light. The projector 1 includes semiconductor lasers, which each produce high-luminance, high-power light, as a light source of an illuminator.

The projector 1 includes a first illuminator 100, a second illuminator 102, a color separation/light guide system 200, a light modulator 400R, a light modulator 400G, a light modulator 400B, a light combining system 500, a projection optical apparatus 600, a fan 32, and an exterior enclosure 33, as shown in FIGS. 1 and 2. The first illuminator 100, the second illuminator 102, the color separation/light guide system 200, the light modulator 400R, the light modulator 400G, the light modulator 400B, the light combining system 500, the projection optical apparatus 600, and the fan 32 are accommodated in the internal space of the exterior enclosure 33.

In the following description, the direction parallel to the optical axis of the projection optical apparatus 600 is referred to as an X-axis direction, the direction defined in an imaginary plane P and perpendicular to the optical axis of the projection optical apparatus 600, which will be described later, is referred to as a Y-axis direction, and the direction perpendicular to the X-axis and Y-axis directions is referred to as a Z-axis direction.

The first illuminator 100 includes a first light source apparatus 10, a heat sink 35, a deflection mirror 37, a homogenizer system 38, a dichroic mirror 80, a collimation/light collection system 90, a rotary fluorescent plate 30, a motor 50, a first lens array 120, a second lens array 130, a polarization converter 140, and a superimposing lens 150.

The first light source apparatus 10 corresponds to the light source apparatus in the appended claims.

The first light source apparatus 10 outputs light E, which is formed of laser light and belongs to a first wavelength band. The light E outputted from the first light source apparatus 10 functions as excitation light that excites a phosphor contained in the rotary fluorescent plate 30. The first wavelength band is, for example, a blue wavelength band ranging from 400 to 495 nm. The first wavelength band may instead, for example, be an ultraviolet wavelength band shorter than 400 nm. The first light source apparatus 10 is formed of a multi-laser-chip package that is a single package that accommodates a plurality of laser chips, as will be described later in detail, or any other light source apparatus.

The first light source apparatus 10 includes a substrate 12, a plurality of sub-mounts 13, a plurality of light emitters 14, a frame 15, a lid 16, and a plurality of lead terminals 17, as shown in FIGS. 4 and 5. The substrate 12, the frame 15, and the lid 16 are members separated from one another and are bonded to each other via a bonding material that will be described later. A bonded section where the substrate 12 and the frame 15 are bonded to each other is referred to as a first bonded section 21, and a bonded section where the frame 15 and the lid 16 are bonded to each other is referred to as a second bonded section 22.

The substrate 12 has a first substrate surface 12a and a second substrate surface 12b, which is located at the side opposite the first substrate surface 12a. The substrate 12 has a substantially square shape, a substantially oblong shape, or any other quadrangular shape in a plan view of the substrate 12 viewed along the direction of a normal to the first substrate surface 12a. The plurality of light emitters 14 are provided at the side facing the first substrate surface 12a of the substrate 12 via the plurality of sub-mounts 13, which will be described later.

The second substrate surface 12b of the substrate 12 is provided with the heat sink 35 for dissipating heat generated from the plurality of light emitters 14 when they emit light. To this end, the substrate 12 is made of a metal material having high thermal conductivity. A metal material of this type is preferably copper, aluminum, or any other metal, and copper is particularly preferably used.

The plurality of sub-mounts 13 are so provided at the first substrate surface 12a of the substrate 12 as to be separate from each other at predetermined intervals in the direction parallel to one side of the substrate 12, as shown in FIG. 4. The plurality of sub-mounts 13 are provided in correspondence with the plurality of light emitters 14. In the present configuration example, the sub-mounts 13 are each so provided as to be a sub-mount common to four of the light emitters 14, but the number of light emitters 14 provided on each of the sub-mounts 13 is not limited to a specific number.

The sub-mounts 13 are made, for example, of aluminum nitride, alumina, or any other ceramic material. The sub-mounts 13 are interposed between the substrate 12 and the light emitters 14 and reduce thermal stress induced by the difference in the coefficient of linear expansion between the substrate 12 and the light emitters 14. The sub-mounts 13 are bonded to the substrate 12 via a silver brazing material, gold-tin solder, or any other bonding material.

The plurality of light emitters 14 are provided at the side facing the first substrate surface 12a of the substrate 12. The light emitters 14 are each formed, for example, of a semiconductor laser, a light emitting diode, or any other solid-state light source. The light emitters 14 may each be a light emitter that outputs light having an arbitrary wavelength in accordance with the application of the first light source apparatus 10. In the present embodiment, the light emitters 14 that each emit blue light that belongs to a wavelength band ranging from 400 to 495 nm, which is a phosphor exciting wavelength band, are each, for example, an edge emitting semiconductor laser made of a nitride-based semiconductor ($In_XAl_YGa_{1-X-Y}N$, $0 \le X \le 1$, $0 \le Y \le 1$, $X+Y \le 1$). In addition to the general formula described above, the light emitters 14 may contain a material in which part of the group-III element is replaced with boron atoms or a material in which part of the nitrogen atom is replaced with phosphor atoms or arsenide atoms as the group-V element.

The plurality of light emitters 14 are so configured that (m×n) semiconductor lasers (m, n: natural number greater than or equal to 2) are arranged in a lattice having m rows and n columns when viewed along the direction of a normal to the first substrate surface 12a of the substrate 12. In the first embodiment, for example, 16 semiconductor lasers are arranged in a lattice having four rows and four columns as the plurality of light emitters 14. A view viewed along the direction of a normal to the first substrate surface 12a of the substrate 12 is referred to as a plan view.

The light emitters 14 are so provided on the sub-mounts 13 that the surface opposite a light exiting surface 14a, out of the six surfaces of each of the box-shaped light emitters 14, faces the first substrate surface 12a of the substrate 12, as shown in FIG. 5. The arrangement described above allows the plurality of light emitters 14 to each output the light E in a direction substantially perpendicular to the first substrate surface 12a of the substrate 12. The light emitters 14 are each so provided on the corresponding sub-mount 13 that the light exiting surface 14a is substantially flush with one end surface 13a of the sub-mount 13. The light emitters 14 are bonded to the sub-mounts 13 via a bonding material (not shown), such as a silver brazing material and gold-tin solder.

The frame 15 is so provided at the side facing the first substrate surface 12a of the substrate 12 as to surround the plurality of light emitters 14. The frame 15 has an annularly quadrangular shape in the plan view. The frame 15 may be so configured that the four sides of the quadrangular shape are formed of a unitary member or a plurality of members are bonded to each other. The frame 15 maintains a fixed distance (gap) between the substrate 12 and the lid 16 and forms part of an accommodation space S, which accommodates the plurality of light emitters 14. To this end, the frame 15 preferably has predetermined rigidity.

The frame 15 serves to reduce stress induced in the lid 16. To this end, the frame 15 is preferably made of a material having a coefficient of linear expansion smaller than the coefficient of linear expansion of the substrate 12 but greater than the coefficient of linear expansion of the lid 16. The frame 15 is preferably made, for example, of a Kovar or any other metal material or alumina, silicon carbide, silicon nitride, or any other ceramic material. The frame 15 is particularly preferably made of Kovar or alumina.

The lid 16 is formed of a translucent member 18, which transmits the light E outputted from each of the plurality of light emitters 14. The lid 16 is so provided as to face the first substrate surface 12a of the substrate 12 and is bonded to a side of the frame 15 that is the side opposite the substrate 12. In the plan view, the lid 16 has a quadrangular shape, including a square shape and an oblong shape. The translucent member 18 is preferably made of a translucent material having high light transmittance. The translucent member 18 is specifically made, for example, of optical glass, including borosilicate glass, such as BK7, quartz glass, and synthetic quartz glass, crystal quartz, or sapphire.

Although not shown, lenses that transmit the light E outputted from the light emitters 14 may be integrated with the translucent member 18.

In the first bonded section 21, the substrate 12 and the frame 15 are bonded to each other via a bonding material 211 containing an organic adhesive. The first bonded section 21 has an annularly quadrangular shape in the plan view, as does the frame 15. The organic adhesive is preferably, for example, a silicone-based adhesive, an epoxy-based adhesive, or acrylic adhesive.

In the second bonded section 22, the frame 15 and the lid 16 are bonded to each other via a bonding material 221 containing a metal material, such as a silver brazing material and gold-tin solder, or an inorganic material, such as low-melting-point glass. The second bonded section 22 has an annularly quadrangular shape in the plan view, as does the frame 15.

As described above, at least one of the first bonded section 21, where the substrate 12 and the frame 15 are bonded to each other, and the second bonded section 22, where the frame 15 and the lid 16 are bonded to each other, contains an organic adhesive. Since the substrate 12 and the frame 15 are bonded to each other in the first bonded section 21 and the frame 15 and the lid 16 are bonded to each other in the second bonded section 22, the space surrounded by the substrate 12, the frame 15, and the lid is isolated from the atmosphere and forms a tightly closed space for accommodating the plurality of light emitters 14 in an airtight manner. The tightly closed space is hereinafter referred to as an accommodation space S. That is, the plurality of light emitters 14 are accommodated in the accommodation space S formed by the substrate 12, the frame 15, and the lid 16.

Since the plurality of light emitters 14 are accommodated in the accommodation space S, adhesion of foreign matter, such as organic substances and moisture, to the light emitters 14 is suppressed. The accommodation space S is preferably maintained in a decompressed state.

The accommodation space S may instead be filled with an inert gas, such as nitrogen gas, or dried air. The decompressed state refers to a state of a space filled with a gas having pressure lower than the atmospheric pressure. In the decompressed state, the gas with which the accommodation space S is filled is preferably an inert gas or dried air.

The frame 15 is provided with a plurality of through holes 15c, as shown in FIG. 4. The lead terminals for supplying the plurality of light emitters 14 with electric power are so provided as to pass through the plurality of through holes 15c. The lead terminals 17 are made, for example, of Kovar. A plated layer made, for example, of nickel-gold is provided at the surface of each of the lead terminals 17.

FIG. 4 shows a case where the plurality of light emitters 14 mounted on one sub-mount 13 are connected in series to each other and a pair of lead terminals 17 are provided at opposite sides of the sub-mount 13. The electrical connection of the plurality of light emitters 14 to each other and the arrangement of the lead terminals 17 are not limited to those in the example shown in FIG. 4 and can be changed as appropriate.

Bonding wires (not shown) that electrically connect one-side ends of the lead terminals 17 to terminals of the light emitters 14 are provided in the accommodation space S. The other-side ends of the lead terminals 17 are connected to an external circuit (not shown). A sealing material seals the gap between the inner wall of each of the through holes 15c of the frame 15 and the corresponding lead terminal 17. The sealing material is preferably, for example, low-melting-point glass.

The heat sink 35 is provided in the second substrate surface 12b of the substrate 12 of the first light source apparatus 10, as shown in FIG. 3. The heat sink 35 dissipates, out of the first light source apparatus 10, heat generated when the plurality of light emitters 14 emit light. The heat sink 35 is formed of a substrate 351 and a plurality of heat dissipation fins 352, which are provided in a first surface 351a of the substrate 351. The heat in the first light source apparatus 10 is dissipated out thereof via the plurality of heat dissipation fins 352.

In the present embodiment, the heat dissipation fins 352 each have an oblong shape, and the lengthwise direction of the heat dissipation fins 352 extends along a first surface 33a of the exterior enclosure 33. Out of the four sides of the oblong shape that forms the contour of each of the heat dissipation fins 352, two long sides 352a and 352b are so disposed as to be substantially parallel to the first surface 33a of the exterior enclosure 33 and the imaginary plane P and two short sides 352c and 352d are so disposed as to be substantially orthogonal to the first surface 33a of the exterior enclosure 33 and the imaginary plane P. The first surface 33a of the exterior enclosure 33 and the imaginary plane P will be described later.

The fan 32 is so provided between the heat sink 35 and the exterior enclosure 33 as to face one lengthwise end of each of the heat dissipation fins 352. A rotary shaft 32c of the fan 32 is disposed along the first surface 33a of the exterior enclosure 33 and in parallel to the X-axis direction. An exhaust port (not shown) is provided in a portion of the exterior enclosure 33 that is a portion in the vicinity of the fan 32. The fan 32 functions as an exhaust fan that exhausts air in the exterior enclosure 33 out thereof. Therefore, when the fan 32 is activated, an air flow F occurs in the exterior enclosure 33, and the air flow F flows from the side away from the fan 32 toward the side close to the fan 32. The fan 32 may be formed, for example, of an axial fan or a centrifugal fan.

The deflection mirror 37 reflects the light E outputted from the first light source apparatus 10 to deflect the optical path of the light E in such a way that the light E travels toward the homogenizer system 38 on the downstream of the deflection mirror 37, as shown in FIG. 3.

The deflection mirror 37 is so disposed as to incline by 45° with respect to the imaginary plane P.

The homogenizer system 38 includes a first lens array 381 and a second lens array 382. The homogenizer system 38 cooperates with the collimation/light collection system 90 to homogenize the illuminance distribution of the light E in an illumination receiving region (phosphor layer 42). The first lens array 381 and the second lens array 382 are each formed of a plurality of lenses arranged in an array.

The dichroic mirror 80 is so disposed as to intersect at 45° the optical axis of the light E having exited out of the homogenizer system 38 and the optical axis of light B outputted from the second illuminator 102, as shown in FIG. 1. The dichroic mirror 80 has wavelength selectivity of reflecting blue light and transmitting yellow fluorescence containing red light and green light.

The collimation/light collection system 90 has the function of causing the light E having exited out of the dichroic mirror 80 to enter in the form of a collected spot the phosphor layer 42 of the rotary fluorescent plate 30 and the function of substantially parallelizing fluorescence Y emitted from the rotary fluorescent plate 30. The collimation/light collection system 90 includes a first lens 92 and a second lens 94. The first lens 92 and the second lens 94 are each formed of a convex lens.

The rotary fluorescent plate 30 includes the motor 50, a circular plate 40, a reflection film 41, and the phosphor layer (wavelength conversion layer) 42. The rotary fluorescent plate 30 is a reflective wavelength converter that emits the fluorescence Y toward the side on which the light E is incident.

The circular plate 40 is formed of a circular plate made of a metal that excels in heat dissipation, for example, aluminum or copper. The circular plate 40 can be rotated by the motor 50. The motor 50 includes a rotary shaft and a hub 55.

The phosphor layer 42 is made of an inorganic material having a disc shape in the plan view. The outer diameter of the phosphor layer 42 is so set as to be smaller than the outer diameter of the circular plate 40. The phosphor layer 42 is excited with the light E outputted from the first light source apparatus 10 and emits the fluorescence Y, which belongs to a third wavelength band. The third wavelength band is, for example, a yellow wavelength band ranging from 500 to 750 nm. That is, the fluorescence Y is yellow light containing red light and green light as the components of the fluorescence Y.

An yttrium-aluminum-garnet-based (YAG-based) phosphor is, for example, used as the material of the phosphor layer 42. Consider YAG:Ce, which contains cerium as an activator, by way of example, and the phosphor layer can be made, for example, of a material produced by mixing raw powder materials containing $Y_2O_3$, $Al_2O_3$, $CeO_3$, and other constituent elements with one another and causing the mixture to undergo a solid-phase reaction, Y—Al—O amorphous particles produced by using a coprecipitation method, a sol-gel method, or any other wet method, or YAG particles produced by using a spray-drying method, a flame-based thermal decomposition method, a thermal plasma method, or any other gas-phase method.

The reflection film 41 is provided between the phosphor layer 42 and the circular plate 40. The reflection film 41 is formed, for example, of a metal film or a dielectric multilayer film and reflects the fluorescence Y having traveled from the phosphor layer 42 toward the circular plate 40.

In the present embodiment, since the light E formed of laser light enters the phosphor layer 42, the phosphor layer 42 generates heat. In the present embodiment, the circular plate 40 is rotated to keep changing the position where the light E enters the phosphor layer 42. The configuration described above prevents a problem of degradation of the phosphor layer 42 that occurs when a specific region of the phosphor layer 42 is always irradiated with the light E so that only part of the phosphor layer 42 is heated.

The second illuminator 102 includes a second light source apparatus 710, a light collection system 760, a light diffuser 732, and a collimation system 770.

The second light source apparatus 710 may be formed of light emitters identical to or different from those of the first light source apparatus 10. The second light source apparatus 710 outputs light that belongs to a second wavelength band. The second wavelength band is, for example, a blue wavelength band ranging from 450 to 495 nm. The second wavelength band to which the light B outputted from the second light source apparatus 710 belongs may coincide with, overlaps with, or differs from the first wavelength band to which the light E outputted from the first light source apparatus 10 belongs.

The light collection system 760 is formed of a convex lens. The light collection system 760 collects the light B outputted from the second light source apparatus 710 into a spot in the vicinity of the light diffuser 732.

The light diffuser 732 diffuses the light B outputted from the second light source apparatus 710 to convert the light B into light B having a light orientation distribution similar to the light orientation distribution of the fluorescence Y emitted from the rotary fluorescent plate 30. The light diffuser 732 can, for example, be a ground glass plate made of optical glass.

The collimation system 770 is formed of a convex lens. The collimation system 770 substantially parallelizes the light having exited out of the light diffuser 732.

In the present embodiment, the light B outputted from the second illuminator 102 is reflected off the dichroic mirror 80. The yellow fluorescence Y having been emitted from the rotary fluorescent plate 30 and having passed through the dichroic mirror 80 is thus combined with the blue light B into white light W. The white light W enters the first lens array 120.

The first lens array 120 includes a plurality of first lenses 122 for dividing the light having exited out of the dichroic mirror 80 into a plurality of sub-light fluxes. The plurality of first lenses 122 are arranged in a matrix in a plane perpendicular to a second optical axis J2, which will be described later.

The second lens array 130 includes a plurality of second lenses 132 corresponding to the plurality of first lenses 122 in the first lens array 120. The second lens array 130, along with the superimposing lens 150, forms images of the first lenses 122 in the first lens array 120 in the vicinity of an image formation region of each of the light modulators 400R, 400G, and 400B. The plurality of second lenses 132 are arranged in a matrix in a plane perpendicular to the second optical axis J2.

The polarization converter 140 converts each of the divided sub-light fluxes from the first lens array 120 into linearly polarized light.

The superimposing lens 150 collects the sub-light fluxes having exited out of the polarization converter 140 into spots and superimposes the spots on one another in the vicinity of the image formation region of each of the light modulators 400R, 400G, and 400B. The first lens array 120, the second lens array 130, and the superimposing lens 150 form an optical integration system that homogenizes the optical intensity distribution of the light emitted from the rotary fluorescent plate 30.

The color separation/light guide system 200 includes a dichroic mirror 210, a dichroic mirror 220, a reflection mirror 230, a reflection mirror 240, a reflection mirror 250, a relay lens 215, a relay lens 225, a relay lens 260, and a relay lens 270. The color separation/light guide system 200 separates the white light W having exited out of the superimposing lens 150 into red light R, green light G, and blue light B and guides the red light R, the green light G, and the blue light B to the light modulators 400R, 400G, and 400B corresponding thereto.

A field lens 300R is disposed between the color separation/light guide system 200 and the light modulator 400R. Similarly, a field lens 300G is disposed between the color separation/light guide system 200 and the light modulator 400G. A field lens 300B is disposed between the color separation/light guide system 200 and the light modulator 400B.

The dichroic mirror 210 reflects the red light and transmits the green light and the blue light. The dichroic mirror 220 reflects the green light and transmits the blue light. The reflection mirror 230 reflects the red light. The reflection mirrors 240 and 250 reflect the blue light.

The red light reflected off the dichroic mirror 210 is reflected off the reflection mirror 230, then passes through the field lens 300R, and is incident on the image formation region of the light modulator 400R for red light.

Out of the green light and the blue light having passed through the dichroic mirror 210, the green light is reflected off the dichroic mirror 220, then passes through the field lens 300G, and is incident on the image formation region of the light modulator 400G for green light.

On the other hand, the blue light passes through the dichroic mirror 220, travels via the relay lens 260, the reflection mirror 240, the relay lens 270, the reflection mirror 250, and the field lens 300B, and is incident on the image formation region of the light modulator 400B for blue light.

The light modulators 400R, 400G, and 400B each include a liquid crystal panel. The light modulators 400R, 400G, and 400B each modulate the color light incident thereon in accordance with image information to form a color image corresponding to the color light. Although not shown, light-incident-side polarizers are disposed on the light incident side of the light modulators 400R, 400G, and 400B, and light-exiting-side polarizers are disposed on the light exiting side of the light modulators 400R, 400G, and 400B.

The light combining system 500 is formed of a cross dichroic prism. The light combining system 500 combines the image light outputted from the light modulator 400R, the image light outputted from the light modulator 400G, and the image light outputted from the light modulator 400B with one another to form a color image. The cross dichroic prism has a configuration in which four right-angle prisms are bonded to each other and has a substantially square shape in the plan view. Dielectric multilayer films are provided along the substantially X-letter shaped interfaces between the bonded right-angle prisms.

The projection optical apparatus 600 is formed of a plurality of projection lenses 6. The projection optical apparatus 600 enlarges the color image light having exited out of the light combining system 500 and projects the enlarged color image light toward a screen SCR. An image is thus formed on the screen SCR.

The optical axis of the projection optical apparatus 600 is called a first optical axis J1. The projection optical apparatus 600, the light combining system 500, the light modulator 400G, the field lens 300G, and the dichroic mirror 220 are disposed along the first optical axis J1. An optical axis passing through the center of the dichroic mirror 220 and perpendicular to the first optical axis J1 is called the second optical axis J2. The reflection mirror 240, the relay lens 260, the dichroic mirror 220, the relay lens 225, the dichroic mirror 210, the superimposing lens 150, the polarization converter 140, the second lens array 130, the first lens array 120, the dichroic mirror 80, and the collimation/light collection system 90 are disposed along the second optical axis J2. The first optical axis J1 is parallel to the axis X, and the second optical axis J2 is parallel to the axis Y.

The exterior enclosure 33 has a substantially box-like shape and has six surfaces, as shown in FIG. 2. The exterior enclosure 33 has the first surface 33a, a second surface 33b, which intersects the first surface 33a, a third surface 33c, which intersects the first surface 33a and the second surface 33b, and a fourth surface 33d, which extends along the first surface 33a and faces the first surface 33a. The first surface 33a and the fourth surface 33d are each a surface parallel to an imaginary plane containing the first optical axis J1 and the second optical axis J2 (plane XY). The second surface 33b is a surface perpendicular to the first optical axis J1. The third surface 33c is a surface perpendicular to the second optical axis J2. The area of the first surface 33a is greater than the areas of the second surface 33b and the third surface 33c. The projector is normally used in an attitude that causes the first surface 33a of the exterior enclosure 33 faces upward in the vertical direction. The exterior enclosure 33 does not necessarily have a complete box-like shape. For example, the edges and corners where the first surface 33a, the second surface, 33b, and the third surface 33c are in contact with one another may be rounded or chamfered.

As described above, many of the optical parts accommodated in the internal space of the exterior enclosure 33 are so disposed that part of each of the parts is located in the imaginary plane containing the first optical axis J1 and the second optical axis J2, which intersect each other. In the following description, an imaginary plane where the projection optical apparatus 600 and the light modulators 400R, 400GF, and 400B are disposed and which contains the first optical axis J1 and the second optical axis J2 is referred to as the imaginary plane P. The imaginary plane P is a plane parallel to the plane XY and extends along the first surface 33a of the exterior enclosure 33.

In the first light source apparatus 10, the first substrate surface 12a or the second substrate surface 12b of the substrate 12 is so provided as to face the first surface 33a of the exterior enclosure 33 and extend along the first surface 33a, as shown in FIG. 3. In the present embodiment, the first substrate surface 12a and the second substrate surface 12b of the substrate 12 are parallel to the first surface 33a of the exterior enclosure 33. The first light source apparatus 10 and the heat sink 35 are not located at the imaginary plane P but are located in a space on one side of the imaginary plane P (upper space).

In the projector 1 according to the present embodiment, the first light source apparatus 10, in which the plurality of light emitters 14 are densely implemented in the single accommodation space S, is used, as shown in FIG. 4. The thus configured first light source apparatus 10, the size thereof can be reduced, whereas the heat density increases when the first light source apparatus 10 outputs light, resulting in a large increase in the temperature of the light emitters 14 and hence a decrease in light emission efficiency thereof. To address the problem, it is required to maximize the size of the heat sink 35 so that the first light source apparatus 10 is sufficiently cooled and an increase in the temperature of the light emitters 14 is suppressed.

In the projector according to related art, however, a light source apparatus is typically so disposed that the substrate surfaces of the light source apparatus are perpendicular to the surface where optical parts are placed, unlike the projector 1 according to the present embodiment. In this configuration, increasing the size of the heat sink inevitably results in an increase in the dimension in the direction perpendicular to the part placement surface, increasing the number of unnecessary spaces in the exterior enclosure, undesirably resulting in an increase in the size of the projector. For example, applying the configuration of related art to the projector 1 according to the present embodiment shown in FIG. 2 causes a problem of a very large increase particularly in the dimension of the projector particularly in the height direction (Z-axis direction).

In contrast, in the projector 1 according to the present embodiment, since the first light source apparatus 10 is so disposed that the first substrate surface 12a and the second substrate surface 12b of the substrate 12 extend along the first surface 33a of the exterior enclosure 33, which is the largest of the surfaces of the exterior enclosure 33, the heat dissipation fins 352 of the heat sink 35 can have a large dimension Lx in the lengthwise direction (X-axis direction) and can still be efficiently accommodated in the space above the imaginary plane P, whereby the exterior enclosure 33 is not unnecessarily large. The first light source apparatus 10 can thus be sufficiently cooled, whereby a compact projector 1 including a first light source apparatus 10 that excels in light emission efficiency can be achieved.

Further, the fan 32 is provided in a position where the rotary shaft 32c extends along the first surface 33a of the exterior enclosure 33 and the fan 32 faces one-side ends of the heat dissipation fins 352 in the lengthwise direction. The air flow F therefore flows along the lengthwise direction of the heat dissipation fins 352 in each space between adjacent heat dissipation fins 352. That is, the air flow F flows in parallel to the surface where the first light source apparatus 10 is in contact with the heat sink 35 and which is required to be most cooled. The air flow F can therefore efficiently cool the plurality of heat dissipation fins 352, whereby the light emission efficiency of the first light source apparatus 10 can be ensured.

Second Embodiment

A second embodiment of the present disclosure will be described below with reference to FIG. 6.

The basic configuration of a projector according to the second embodiment is the same as that of the projector according to the first embodiment, but the configurations of the light source apparatus and the heat sink differ from those in the first embodiment. No description of the projector or the light source apparatus will therefore be made, and only the points different from those in the first embodiment will be described.

Figure 6:
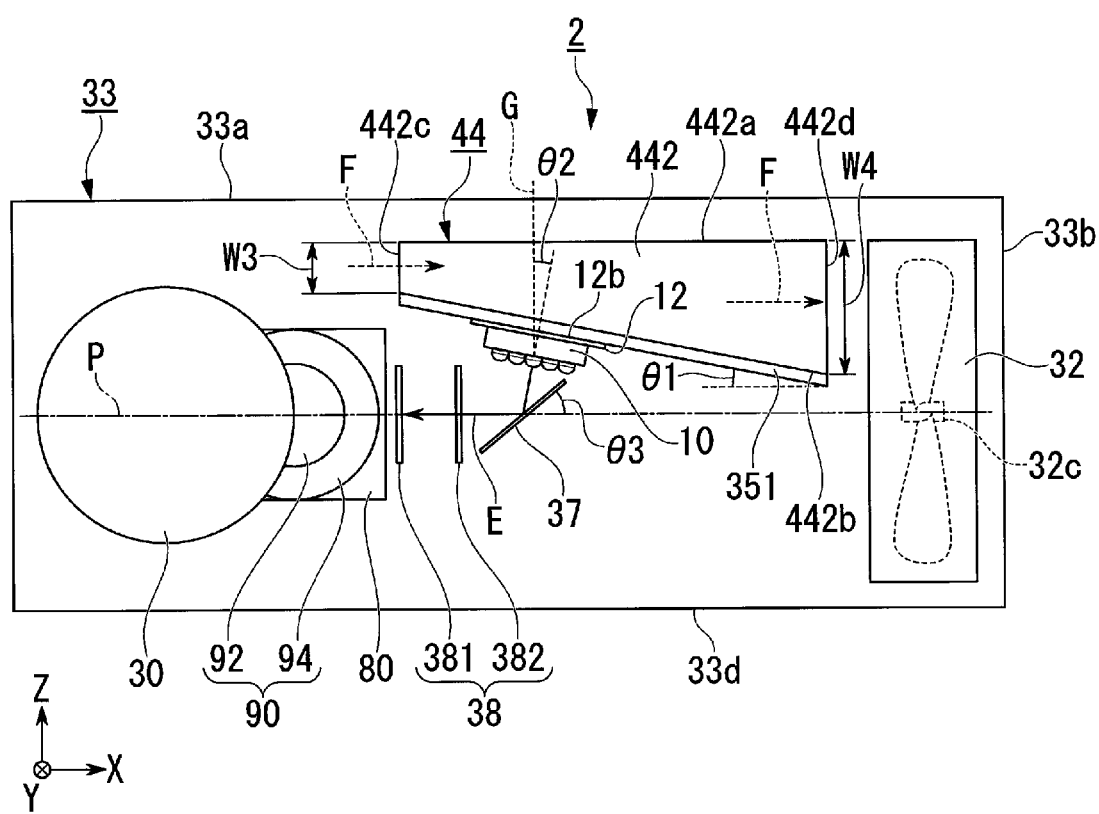
FIG. 6 is a diagrammatic view of a projector according to a second embodiment viewed through a side surface of the projector.

FIG. 6 is a cross-sectional view of the projector according to the second embodiment.

In FIG. 6, the same components as those in the drawings used in the first embodiment have the same reference characters and will not be described in detail.

In a projector 2 according to the second embodiment, the first light source apparatus 10 is so disposed that the second substrate surface 12b of the substrate 12 intersects the imaginary plane P and the first surface 33a of the exterior enclosure 33, as shown in FIG. 6. That is, the second substrate surface 12b of the substrate 12 of the first light source apparatus 10 inclines by an angle θ1 with respect to the imaginary plane P and the first surface 33a of the exterior enclosure 33. The first light source apparatus 10 and a heat sink 44 are disposed in the space above the imaginary plane P, as in the first embodiment.

In the present embodiment, heat dissipation fins 442 each have a substantially trapezoidal shape, and the lengthwise direction of the heat dissipation fins 442 extends along the first surface 33a of the exterior enclosure 33. Out of the four sides of the quadrangular shape that forms the contour of each of the heat dissipation fins 442, a first side 442a, which faces the first surface 33a of the exterior enclosure 33, is so disposed as to be substantially parallel to the first surface 33a of the exterior enclosure 33 and the imaginary plane P. A second side 442b, which faces the first side 442a, is so disposed as to incline with respect to the first surface 33a of the exterior enclosure 33 and the imaginary plane P. A third side 442c and a fourth side 442d, which are parallel to each other, are so disposed as to be substantially perpendicular to the first surface 33a of the exterior enclosure 33 and the imaginary plane P. Let W3 be the dimension of the third side 442c, which is located in an upstream portion of the air flow F, and W4 be the dimension of the fourth side 442d, which is located in a downstream portion of the air flow F, and the dimension W4 is greater than the dimension W3. The dimension of the heat dissipation fins 442 in the widthwise direction increases from the upstream portion of the air flow F toward the downstream portion thereof.

In the present embodiment, the deflection mirror 37 is so disposed that an angle θ3 between the imaginary plane P and the deflection mirror 37 is smaller than 45°. Specifically, let θ1 (°) be the inclination angle of the first light source apparatus 10 with respect to the imaginary plane P and θ2 (°) be the exiting angle of the light E with respect to a vertical plane G, as shown in FIG. 6, and the exiting angle θ2 is equal to the inclination angle θ1 (θ2=θ1). Let θ3 (°) be the angle between the imaginary plane P and the deflection mirror 37, and θ3=45°-(θ1/2) is satisfied. According to the configuration described above, even when the first light source apparatus 10 is so disposed as to incline with respect to the imaginary plane P, the light is allowed to enter the optical system on the downstream of the deflection mirror 37 at right angles.

The other configuration of the projector 2 is the same as that of the projector 1 according to the first embodiment.

Also in the present embodiment, the same effect as that provided by the first embodiment is provided, that is, the first light source apparatus 10 can be sufficiently cooled, whereby a compact projector 2 including a first light source apparatus 10 that excels in light emission efficiency can be achieved.

Further, as the air flow F flows through the gaps between the plurality of heat dissipation fins 442, the temperature of the air flow F gradually increases due to heat exchange between the air flow F and the heat dissipation fins 442. The cooling performance of the portion of each the heat dissipation fins 442 that corresponds to the downstream portion of the air flow F therefore tends to be lower than the cooling performance of the portion of the heat dissipation fin 442 that corresponds to the upstream portion of the air flow F. To solve the problem, in the present embodiment, the dimension of the heat dissipation fins 442 in the widthwise direction increases from the upstream portion of the air flow F toward the downstream portion thereof, whereby the decrease in the cooling performance can be compensated by the increase in the area of the heat dissipation fins 442 in the downstream portion of the air flow F.

Third Embodiment

A third embodiment of the present disclosure will be described below with reference to FIG. 7.

The basic configuration of a projector according to the third embodiment is the same as that of the projector according to the first embodiment, but the configurations of the light source apparatus and the heat sink differ from those in the first embodiment. No description of the projector or the light source apparatus will therefore be made, and only the points different from those in the first embodiment will be described.

Figure 7:
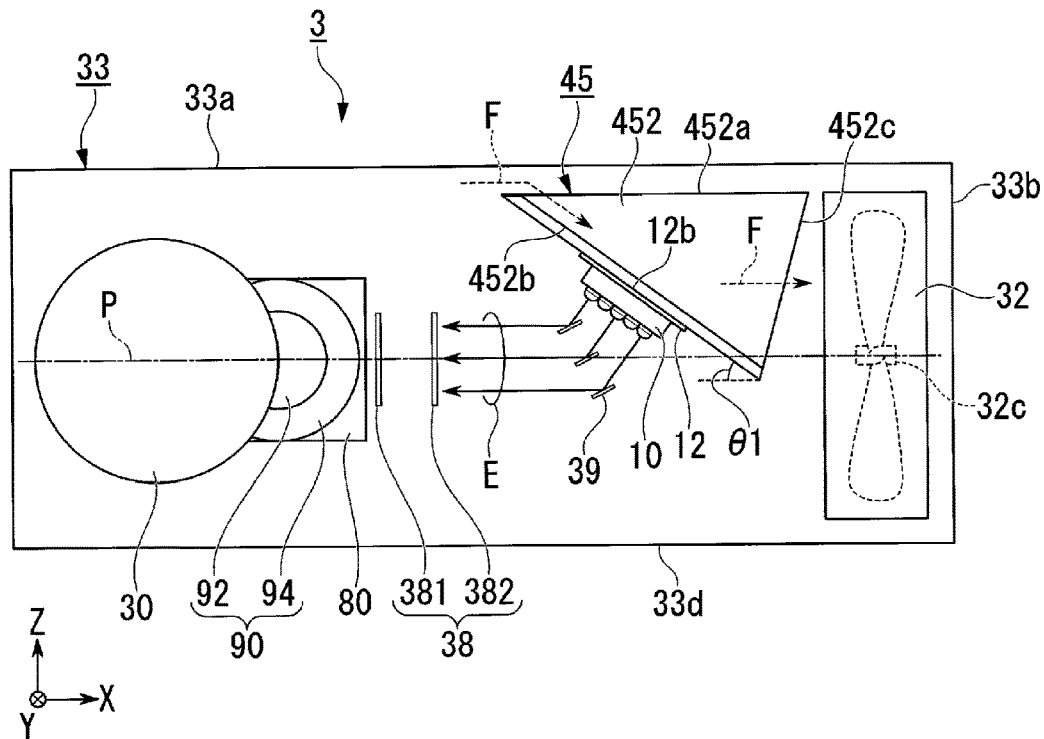
FIG. 7 is a diagrammatic view of a projector according to a third embodiment viewed through a side surface of the projector.

FIG. 7 is a cross-sectional view of the projector according to the third embodiment.

In FIG. 7, the same components as those in the drawings used in the first embodiment have the same reference characters and will not be described in detail.

In a projector 3 according to the third embodiment, the first light source apparatus 10 is so disposed that the second substrate surface 12b of the substrate 12 intersects the imaginary plane P and the first surface 33a of the exterior enclosure 33, as shown in FIG. 7. That is, the second substrate surface 12b of the substrate 12 of the first light source apparatus 10 inclines by the angle θ1 with respect to the imaginary plane P and the first surface 33a of the exterior enclosure 33. The first light source apparatus 10 is disposed in the space above the imaginary plane P. A heat sink 45 is do disposed that part thereof is located in the imaginary plane P.

In the present embodiment, heat dissipation fins 452 each have a substantially triangular shape. Out of the three sides of the triangular shape that forms the contour of each of the heat dissipation fins 452, a first side 452a, which faces the first surface 33a of the exterior enclosure 33, is so disposed as to be substantially parallel to the first surface 33a of the exterior enclosure 33 and the imaginary plane P. A second side 452b, where the first light source apparatus 10 is provided, is so disposed as to incline with respect to the first surface 33a of the exterior enclosure 33 and the imaginary plane P and intersects the imaginary plane P. A third side 452c is so disposed as to incline with respect to the first surface 33a of the exterior enclosure 33 and the imaginary plane P and intersects the imaginary plane P.

In the present embodiment, a plurality of deflection mirrors 39 are so provided in correspondence with the plurality of optical paths of the light E outputted from the plurality of light emitters. According to the configuration described above, even when the first light source apparatus 10 is so disposed in a position very close to the imaginary plane P as to incline with respect thereto, the light is allowed to enter the optical system on the downstream of the first light source apparatus 10 at right angles.

The other configuration of the projector 3 is the same as that of the projector 1 according to the first embodiment.

Also in the present embodiment, the same effect as that provided by the first embodiment is provided, that is, the first light source apparatus 10 can be sufficiently cooled, whereby a compact projector 3 including a first light source apparatus 10 that excels in light emission efficiency can be achieved.

Further, also in the present embodiment, since the area of each of the heat dissipation fins 452 in the downstream portion of the air flow F is greater than the area of the heat dissipation fin 452 in the upstream portion of the air flow F, the same effect provided by the second embodiment is provided, that is, the decrease in the cooling performance of the downstream portion of the heat dissipation fins 452 can be compensated.

Fourth Embodiment

A fourth embodiment of the present disclosure will be described below with reference to FIG. 8.

The basic configuration of a projector according to the fourth embodiment is the same as that of the projector according to the first embodiment, but the configurations of the light source apparatus and the deflection mirror differ from those in the first embodiment. No description of the projector or the light source apparatus will therefore be made, and only the points different from those in the first embodiment will be described.

Figure 8:
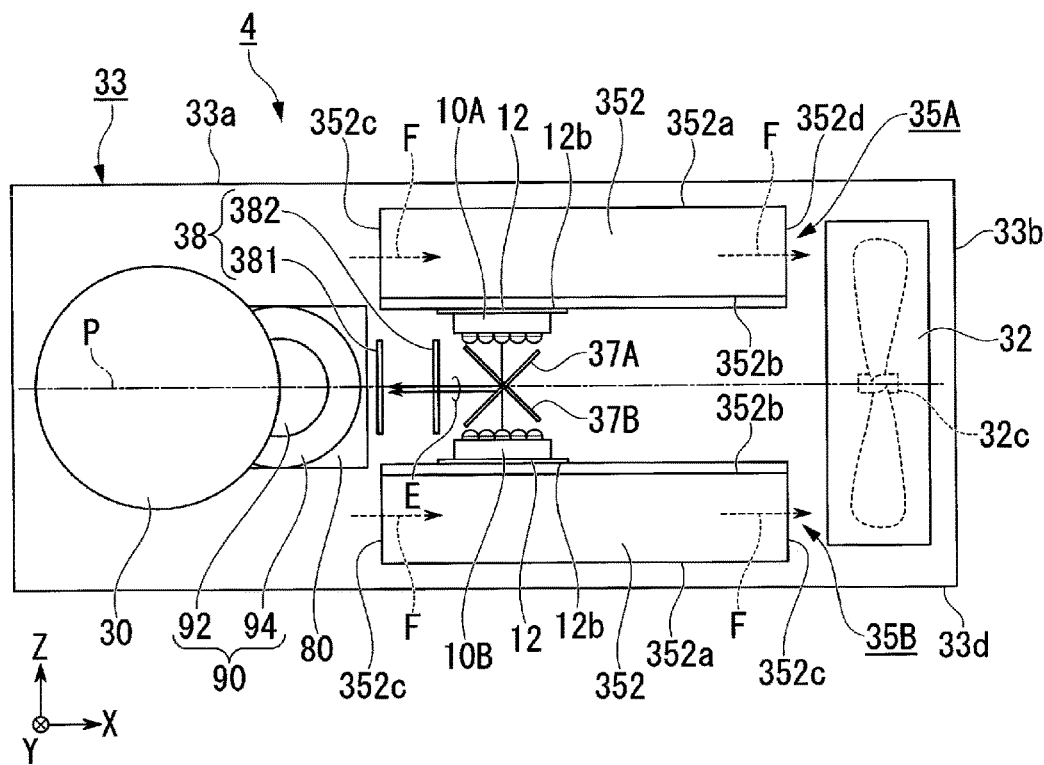
FIG. 8 is a diagrammatic view of a projector according to a fourth embodiment viewed through a side surface of the projector.

FIG. 8 is a cross-sectional view of the projector according to the fourth embodiment.

In FIG. 8, the same components as those in the drawings used in the first embodiment have the same reference characters and will not be described in detail.

In a projector 4 according to the fourth embodiment, first light source apparatuses 10A and 10B and heat sinks 35A and 35B are provided in the spaces above and below the imaginary plane P, respectively, as shown in FIG. 8. In the following description, the first light source apparatus 10A provided in the space above the imaginary plane P is referred to as an upper first light source apparatus 10A, and the first light source apparatus 10B provided in the space below the imaginary plane P is referred to as a lower first light source apparatus 10B. The upper first light source apparatus 10A outputs light toward the fourth surface 33d of the exterior enclosure 33, that is, downward in the vertical direction. The lower first light source apparatus 10B outputs light toward the first surface 33a of the exterior enclosure 33, that is, upward in the vertical direction. The upper first light source apparatus 10A is so provided that the second substrate surface 12b of the substrate 12 faces the imaginary plane P and the first surface 33a of the exterior enclosure 33. The lower first light source apparatus 10B is so provided that the second substrate surface 12b of the substrate 12 faces the imaginary plane P and the fourth surface 33d of the exterior enclosure 33. That is, the second substrate surface 12b of the substrate 12 of each of the first light source apparatuses 10A and 10B is so disposed as to be substantially parallel to the imaginary plane P and the first surface 33a and the fourth surface 33d of the exterior enclosure 33, respectively. In the following embodiment, the upper first light source apparatus corresponds to the first light source apparatus in the appended claims, and the lower first light source apparatus corresponds to the second light source apparatus in the appended claims.

In the present embodiment, the heat dissipation fins 352 each have a substantially oblong shape, and the lengthwise direction of the heat dissipation fins 352 extends along the first surface 33a of the exterior enclosure 33. The heat sink 35A provided in the upper first light source apparatus 10A and the heat sink 35B provided in the lower first light source apparatus 10B are identical to each other and also identical to the heat sink 35 in the first embodiment.

In the present embodiment, the deflection mirror is formed of a first deflection mirror 37A for deflecting the light E outputted from the upper first light source apparatus 10A and a second deflection mirror 37B for deflecting the light E outputted from the lower first light source apparatus 10B. The first deflection mirror 37A and the second deflection mirror 37B are each formed of a plurality of strip-shaped mirrors, and the plurality of mirrors that form the first deflection mirror 37A and the plurality of mirrors that form the second deflection mirror 37B intersect each other. According to the configuration described above, the light E outputted from the upper first light source apparatus 10A and the light E outputted from the lower first light source apparatus 10B can both be guided to the downstream optical system.

The other configuration of the projector 4 is the same as that of the projector 1 according to the first embodiment.

Also in the present embodiment, the same effect as that provided by the first embodiment is provided, that is, the first light source apparatuses 10A and 10B can be sufficiently cooled, whereby a compact projector 4 including first light source apparatuses 10A and 10B that excel in light emission efficiency can be achieved.

Further, in the present embodiment, since the upper first light source apparatus 10A and the lower first light source apparatus 10B use the heat sinks 35A and 35B, which have the same configuration, the flow resistance against the air flow F flowing along the heat sink 35A is substantially equal to the flow resistance against the air flow F flowing along the heat sink 35B. As a result, the air flow F is allowed to flow equally in the first light source apparatuses 10A and 10B, whereby the first light source apparatuses 10A and 10B can be efficiently cooled.

Fifth Embodiment

A fifth embodiment of the present disclosure will be described below with reference to FIG. 9.

The basic configuration of a projector according to the fifth embodiment is the same as that of the projector according to the first embodiment, but the configurations of the light source apparatus, the heat sink, and the deflection mirror differ from those in the first embodiment. No description of the projector or the light source apparatus will therefore be made, and only the points different from those in the first embodiment will be described.

Figure 9:
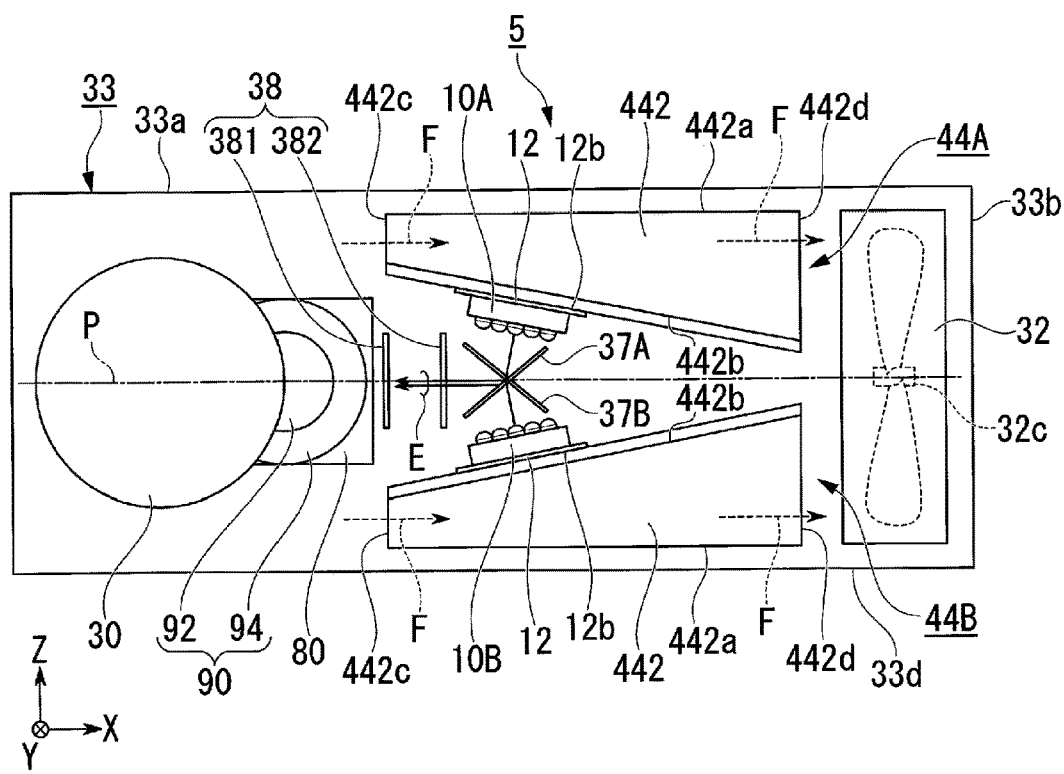
FIG. 9 is a diagrammatic view of a projector according to a fifth embodiment viewed through a side surface of the projector.

FIG. 9 is a cross-sectional view of the projector according to the fifth embodiment.

In FIG. 9, the same components as those in the drawings used in the first embodiment have the same reference characters and will not be described in detail.

In a projector 5 according to the fifth embodiment, the first light source apparatuses 10A and 10B and heat sinks 44A and 44B are provided in the spaces above and below the imaginary plane P, respectively, as shown in FIG. 9. The upper first light source apparatus 10A and the lower first light source apparatus 10B are each so disposed that the second substrate surface 12b of the substrate 12 inclines with respect to the imaginary plane P and the first surface 33a of the exterior enclosure 33.

In the present embodiment, the heat dissipation fins 442 each have a substantially trapezoidal shape, and the lengthwise direction of the heat dissipation fins 442 extends along the first surface 33a of the exterior enclosure 33. The heat sink 44A provided in the upper first light source apparatus 10A and the heat sink 44B provided in the lower first light source apparatus 10B are identical to each other and also identical to the heat sink 44 in the second embodiment.

The deflection mirror is formed of the first deflection mirror 37A for deflecting the light E outputted from the upper first light source apparatus 10A and the second deflection mirror 37B for deflecting the light E outputted from the lower first light source apparatus 10B. The first deflection mirror 37A and the second deflection mirror 37B are each formed of a plurality of strip-shaped mirrors, and the plurality of mirrors that form the first deflection mirror 37A and the plurality of mirrors that form the second deflection mirror 37B intersect each other.

The other configuration of the projector 5 is the same as that of the projector 1 according to the first embodiment.

Also in the present embodiment, the same effect as that provided by the first embodiment is provided, that is, the first light source apparatuses 10A and 10B can be sufficiently cooled, whereby a compact projector 5 including first light source apparatuses 10A and 10B that excel in light emission efficiency can be achieved.

The projector 5 according to the present embodiment, which includes the two first light source apparatuses 10A and 10B, produces a bright image.

Also in the present embodiment, since the area of each of the heat dissipation fins 442 in the downstream portion of the air flow F is greater than the area of the heat dissipation fin 442 in the upstream portion of the air flow F, the same effect provided by the second embodiment is provided, that is, the decrease in the cooling performance of the downstream portion of the heat dissipation fins 442 can be compensated.

Also in the present embodiment, since the air flow is allowed to flow equally in both the first light source apparatuses 10A and 10B, the same effect provided by the fourth embodiment is provided, that is, the first light source apparatuses 10A and 10B can both be efficiently cooled.

Sixth Embodiment

A sixth embodiment of the present disclosure will be described below with reference to FIG. 10.

The basic configuration of a projector according to the sixth embodiment is the same as that of the projector according to the first embodiment, but the configurations of the light source apparatus, the heat sink, and the deflection mirror differ from those in the first embodiment. No description of the projector or the light source apparatus will therefore be made, and only the points different from those in the first embodiment will be described.

Figure 10:
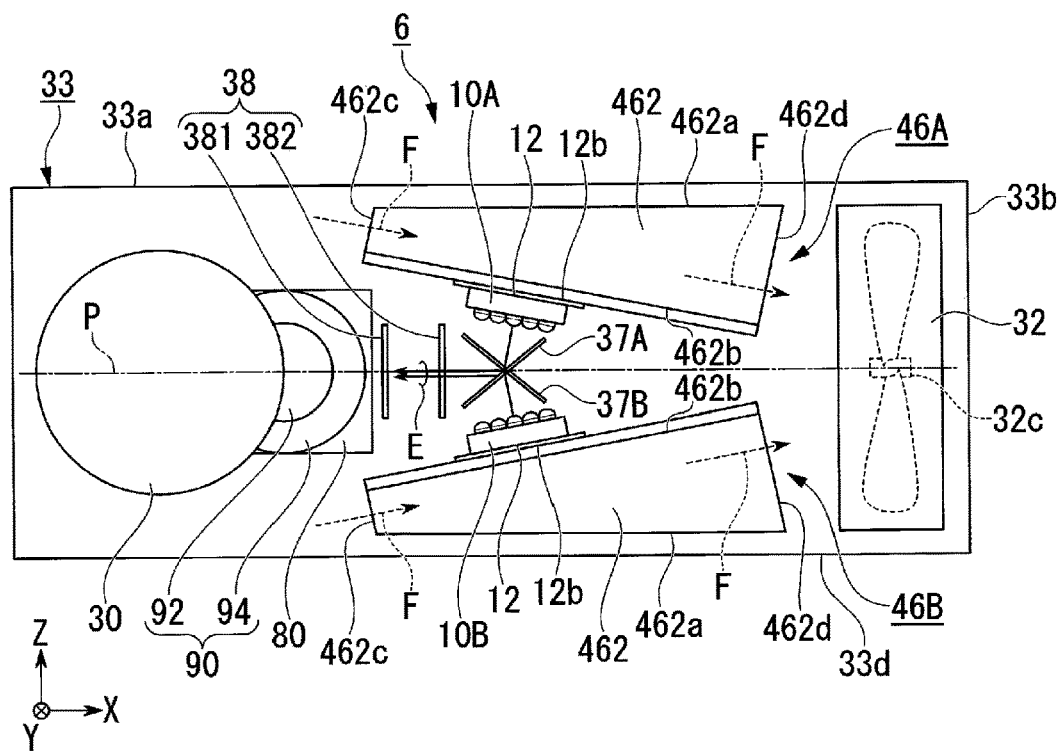
FIG. 10 is a diagrammatic view of a projector according to a sixth embodiment viewed through a side surface of the projector.

FIG. 10 is a cross-sectional view of the projector according to the sixth embodiment.

In FIG. 10, the same components as those in the drawings used in the first embodiment have the same reference characters and will not be described in detail.

A projector 6 according to the sixth embodiment differs from the projector according to the fifth embodiment only in terms of the shape of heat dissipation fins 462 of each of heat sinks 46A and 46B. The heat dissipation fins 462 each have a substantially trapezoidal shape, as shown in FIG. 10. Out of the four sides of the trapezoidal shape that forms the contour of each of the heat dissipation fins 462, a first side 462a, which faces the first surface 33a of the exterior enclosure 33, is so disposed as to be substantially parallel to the first surface 33a of the exterior enclosure 33 and the imaginary plane P. A second side 462b, which faces the first side 462a, is so disposed as to incline with respect to the first surface 33a of the exterior enclosure 33 and the imaginary plane P. A third surface 462c corresponding to the upstream portion of the air flow F and a fourth surface 462d corresponding to the downstream portion of the air flow F each incline with respect to the direction of a normal to the first surface 33a of the exterior enclosure 33 and the imaginary plane P.

The other configuration of the projector 6 is the same as that of the projector 5 according to the fifth embodiment.

Also in the present embodiment, the same effect as that provided by the first embodiment is provided, that is, the first light source apparatuses 10A and 10B can be sufficiently cooled, whereby a compact projector 6 including first light source apparatuses 10A and 10B that excel in light emission efficiency can be achieved.

Also in the present embodiment, the same effect as that provided by the fifth embodiment is provided, that is, a projector 6 capable of producing a bright image can be achieved.

Also in the present embodiment, since the area of each of the heat dissipation fins 462 in the downstream portion of the air flow F is greater than the area of the heat dissipation fin 462 in the upstream portion of the air flow F, the same effect provided by the second embodiment is provided, that is, the decrease in the cooling performance of the downstream portion of the heat dissipation fins 462 can be compensated.

Also in the present embodiment, since the air flow is allowed to flow equally in both the first light source apparatuses 10A and 10B, the same effect provided by the fourth embodiment is provided, that is, the first light source apparatuses 10A and 10B can both be efficiently cooled.

Seventh Embodiment

A seventh embodiment of the present disclosure will be described below with reference to FIG. 11.

The basic configuration of a projector according to the seventh embodiment is the same as that of the projector according to the first embodiment, but the configurations of the light source apparatus, the heat sink, and the deflection mirror differ from those in the first embodiment. No description of the projector or the light source apparatus will therefore be made, and only the points different from those in the first embodiment will be described.

Figure 11:
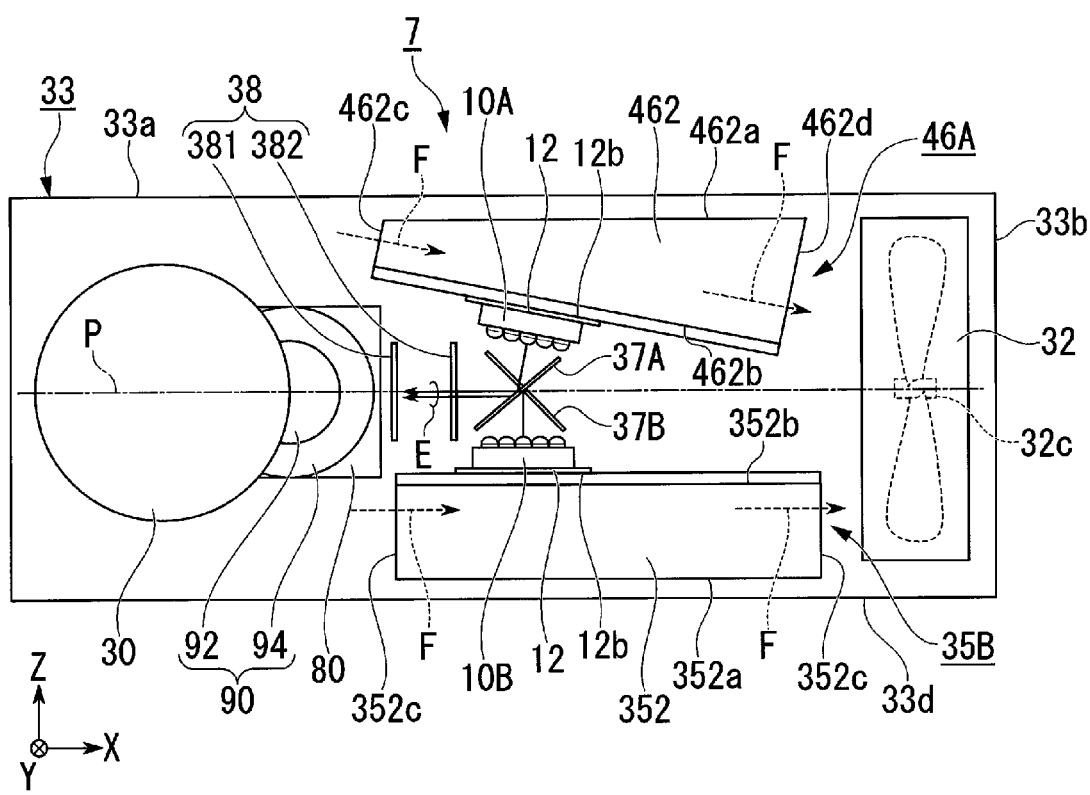
FIG. 11 is a diagrammatic view of a projector according to a seventh embodiment viewed through a side surface of the projector.

FIG. 11 is a cross-sectional view of the projector according to the seventh embodiment.

In FIG. 11, the same components as those in the drawings used in the previous embodiments have the same reference characters and will not be described in detail.

In a projector 7 according to the seventh embodiment, the first light source apparatuses 10A and 10B and the heat sinks 46A and 35B are provided in the spaces above and below the imaginary plane P, respectively, as shown in FIG. 11. The upper first light source apparatus 10A is so disposed that the second substrate surface 12b of the substrate 12 inclines with respect to the imaginary plane P and the first surface 33a of the exterior enclosure 33. The lower first light source apparatus 10B is so disposed that the second substrate surface 12b of the substrate 12 is parallel to the imaginary plane P and the first surface 33a of the exterior enclosure 33. The shape of the heat dissipation fins 462 of the heat sink 46A provided in the upper first light source apparatus 10A and the shape of the heat dissipation fins 352 of the heat sink 35B provided in the lower first light source apparatus 10B differ from each other.

The other configuration of the projector 7 is the same as that of the projector 6 according to the sixth embodiment.

Also in the present embodiment, the same effect as that provided by the first embodiment is provided, that is, the first light source apparatuses 10A and 10B can be sufficiently cooled, whereby a compact projector 7 including first light source apparatuses 10A and 10B that excel in light emission efficiency can be achieved.

Also in the present embodiment, the same effect as that provided by the fifth embodiment is provided, that is, a projector 7 capable of producing a bright image can be achieved.

Also in the present embodiment, since the area of each of the heat dissipation fins 462 in the downstream portion of the air flow F is greater than the area of the heat dissipation fin 462 in the upstream portion of the air flow F, the decrease in the cooling performance of the downstream portion of the heat dissipation fins 462 can be compensated.

In the present embodiment, in which the shape of the upper heat dissipation fins 462 differs from the shape of the lower heat dissipation fins 352, the air flow F is not allowed to equally flow along the two heat sinks 46A and 35B. The shapes of the heat dissipation fins 462 and 352 can, however, be differentiated from each other as appropriate in accordance with the cooling performance required for the first light source apparatuses 10A and 10B.

The projectors 1, 2, 3, 4, 5, 6, and 7 according to the embodiments described above may include a first light source apparatus according to any of the following variations in place of the first light source apparatus 10 described above.

First Variation

Figure 12:
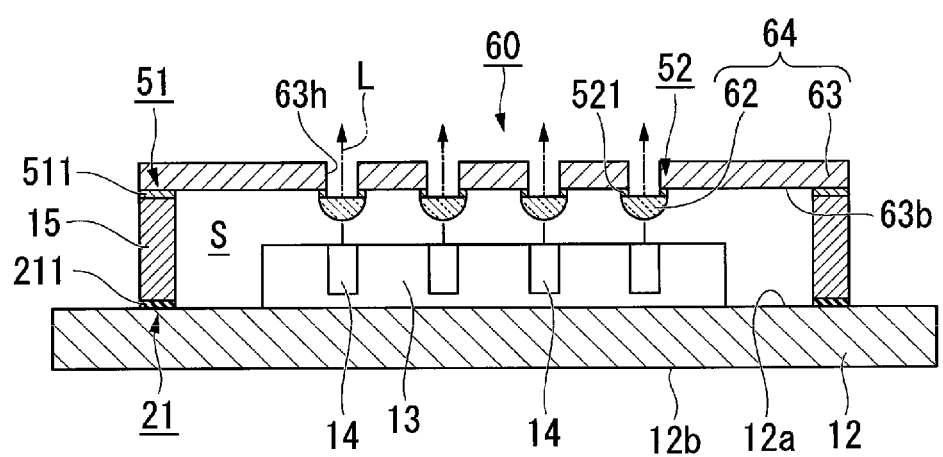
FIG. 12 is a cross-sectional view of a light source apparatus according to a first variation.

FIG. 12 is a cross-sectional view of a first light source apparatus according to a first variation.

In FIG. 12, the same components as those in FIG. 5 used in the first embodiment have the same reference characters and will not be described in detail.

A first light source apparatus 60 according to the first variation includes the substrate 12, the plurality of sub-mounts 13, the plurality of light emitters 14, the frame 15, a lid 64, and the plurality of lead terminals 17, as shown in FIG. 12. The substrate 12, the frame 15, and the lid 64 are members separate from one another and are bonded to each other via a bonding material that will be described later.

The lid 64 includes a plurality of translucent members 62 and a support member 63, to which the plurality of translucent members 62 are bonded. The plurality of translucent members 62 are bonded to a surface 63b out of the two surfaces of the support member 63, which is the surface facing the first substrate surface 12a of the substrate 12 (lower surface in FIG. 12).

The support member 63 is formed of a rectangular plate in the plan view and has openings 63h in the positions corresponding to the paths of light L outputted from the light emitters 14. That is, the number of openings 63h of the support member 63 is equal to the number of light emitters 14. The support member 63 is bonded to a side of the frame 15 that is the side opposite the substrate 12. The support member 63 is made of a metal material, for example, copper or aluminum. A plated layer made, for example, of nickel may be provided in the surface of the support member 63.

The plurality of translucent members 62 are each formed of a plano-convex lens. The translucent members 62, which are each formed of a plano-convex lens, have the function of collecting the light L outputted from the corresponding light emitter 14 into a spot. The translucent members 62 have an outer dimension one size greater than that of the openings 63h of the support member 63 in the plan view. The translucent members 62 are preferably made of a translucent material having high light transmittance. The translucent members 62 are specifically made, for example, of optical glass, including borosilicate glass, such as BK7, quartz glass, and synthetic quartz glass, crystal quartz, or sapphire.

The translucent members 62 are not each necessarily formed of a plano-convex lens and may be formed of a planar plate when the light collection function is not particularly required. The translucent members 62 may each be bonded to a surface of the support member 63 that is the surface opposite the surface 63b (upper surface in FIG. 12).

In the first bonded section 21, the substrate 12 and the frame 15 are bonded to each other via the bonding material 211 containing an organic adhesive. The organic adhesive is preferably, for example, a silicone-based adhesive, an epoxy-based adhesive, or acrylic adhesive.

In a third bonded section 51 (second bonded section), the frame 15 and the support member 63 (lid 64) are bonded to each other via a bonding material 511 containing a metal material, such as a silver brazing material and gold-tin solder, or an inorganic material, such as low-melting-point glass.

In fourth bonded sections 52, the support member 63 and the translucent members 62 are bonded to each other via a bonding material 521 containing a metal material, such as a silver brazing material and gold-tin solder, or an inorganic material, such as low-melting-point glass.

Second Variation

Figure 13:
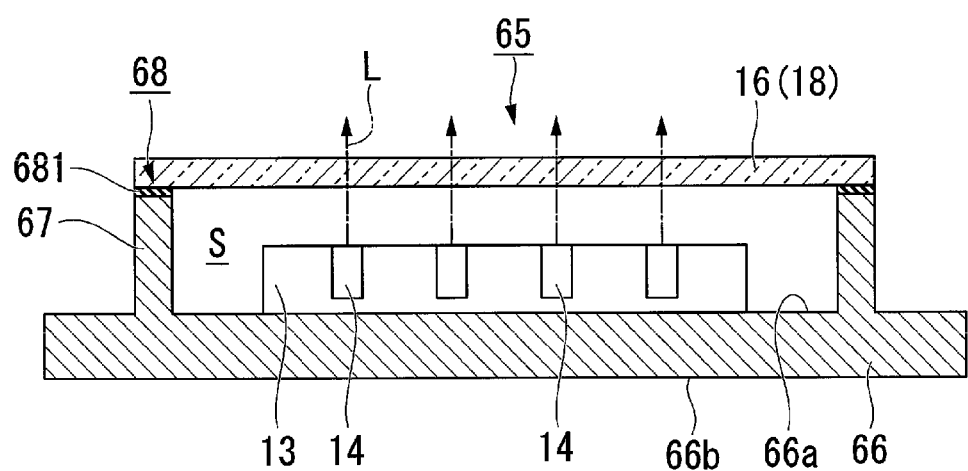
FIG. 13 is a cross-sectional view of a light source apparatus according to a second variation.

FIG. 13 is a cross-sectional view of a first light source apparatus according to a second variation.

In FIG. 13, the same components as those in FIG. 5 used in the first embodiment have the same reference characters and will not be described in detail.

A first light source apparatus 65 according to the second variation includes a substrate 66, the plurality of sub-mounts 13, the plurality of light emitters 14, the lid 16, and the plurality of lead terminals 17 (not shown), as shown in FIG. 13. The substrate 66 and the lid 16 are members separate from each other and are bonded to each other via a bonding material that will be described later.

The substrate 66 is formed of a plate having a first substrate surface 66a, a second substrate surface 66b, and a wall 67 provided in the first substrate surface 66a. The plurality of light emitters 14 are provided at the side facing the first substrate surface 66a of the substrate 66 via the plurality of sub-mounts 13.

The wall 67 is so provided integrally with the substrate 66 as to protrude from the first substrate surface 66a of the substrate 66 to surround the plurality of light emitters 14. The wall 67 maintains a fixed distance (gap) between the substrate 66 and the lid 16 and forms part of the accommodation space S, which accommodates the plurality of light emitters 14, as the frame 15 in the first embodiment. The substrate 66 is made of a metal material having high thermal conductivity, such as, copper or aluminum.

The lid 16 is formed of the translucent member 18, which transmits the light L outputted from each of the plurality of light emitters 14. The translucent member 18 is made, for example, of optical glass, including borosilicate glass and quartz glass, crystal quartz, or sapphire. The lid 16 is so provided as to face the first substrate surface 66a of the substrate 66 and is bonded to the upper surface of the wall 67 protruding from the first substrate surface 66a.

In a second bonded section 68, the wall 67 and the lid 16 are bonded to each other via a bonding material 681 containing an organic adhesive. The organic adhesive is preferably, for example, a silicone-based adhesive, an epoxy-based adhesive, or acrylic adhesive. That is, the second bonded section 68, where the wall 67 and the lid 16 are bonded to each other, contains an organic adhesive.

The technical range of the present disclosure is not limited to the embodiments described above, and a variety of changes can be made thereto to the extent that the changes do not depart from the substance of the present disclosure.

For example, in the embodiments described above, the case where the light source apparatuses each include the sub-mounts has been presented by way of example, but the light source apparatuses do not each necessarily include the sub-mounts. Further, irrespective of whether or not the sub-mounts are provided, the direction in which the light from each of the plurality of light emitters exits may be perpendicular to or parallel to the first substrate surface of the substrate. In the case where the light exiting direction is parallel to the first substrate surface of the substrate, a prism or any other optical element may be used to deflect the optical path of the light from each of the light emitters and guide the light to the translucent member.

The specific descriptions on the specific configurations of the shape, the size, the number, the arrangement, the material, and other factors of the variety of members including the substrate, the light emitters, the frame, the lid, the support member, the translucent member, and other components that form each of the light source apparatuses are not limited to those in the embodiments described above and can be changed as appropriate.

The above embodiments have been described with reference to the case where the present disclosure is applied to a transmissive projector, and the present disclosure is also applicable to a reflective projector. The term "transmissive" used herein means that a liquid crystal light valve, including a liquid crystal panel or any other component, transmits light. The term "reflective" means that the liquid crystal light valve reflects light. The light modulators are each not limited to a liquid crystal light valve and may each, for example, be a digital micromirror device.

The above embodiments have been described with reference to a projector including three liquid crystal panels. The present disclosure is also applicable to a projector using only one liquid crystal light valve and a projector using four or more liquid crystal light valves.

In the embodiments described above, the projector including the reflective wavelength converter has been presented by way of example. A projector including a transmissive wavelength converter may instead be employed. Further, the case where the projector includes the wavelength converter has been presented, but no wavelength converter may be provided. In this case, as the light source apparatus of the projector, the light source apparatus described above may be used as at least one of a light source apparatus that outputs red light, a light source apparatus that outputs green light, and a light source apparatus that outputs blue light.

The projector according to each of the embodiments described above has been described with reference to the case where the light source apparatus includes the light emitters as the second light source apparatus that produces blue light, but no light emitters may necessarily be provided. For example, the light outputted from the first light source apparatus may be divided by a polarization separator into two light fluxes, with one of the light fluxes guided to the rotary fluorescent plate and the other light flux guided to the diffuser.

What is claimed is:

1. A projector comprising:
a light source apparatus that outputs light;
a light modulator that modulates the light outputted from the light source apparatus in accordance with image information;
a projection optical apparatus that projects the light modulated by the light modulator;
an exterior enclosure that accommodates the light source apparatus, the light modulator, and the projection optical apparatus; and
a heat sink including a heat dissipation fin that dissipates heat in the light source apparatus,
wherein the light source apparatus includes a substrate having a first substrate surface and a second substrate surface located at a side opposite the first substrate surface, a plurality of light emitters provided at a side facing the first substrate surface of the substrate, a frame so provided at the side facing the first substrate surface of the substrate as to surround the plurality of light emitters, and a lid including a translucent member that transmits light outputted from the plurality of light emitters, so provided as to face the first substrate surface, and bonded to a side of the frame that is a side opposite the substrate,
the plurality of light emitters are accommodated in an accommodation space formed by the substrate, the frame, and the lid,
the exterior enclosure has a first surface, a second surface that intersects the first surface, and a third surface that intersects the first and second surfaces,
an area of the first surface is greater than areas of the second and third surfaces,
the first or second substrate surface faces the first surface, and
a lengthwise direction of the heat dissipation fin extends along the first surface of the exterior enclosure.

2. The projector according to claim 1, wherein the first or second substrate surface extends along the first surface.

3. The projector according to claim 1,
wherein the exterior enclosure further has a fourth surface that extends along the first surface of the exterior enclosure and faces the first surface,
the light source apparatus includes a first light source apparatus so provided as to face the first surface and a second light source apparatus so provided as to face the fourth surface, and
the first light source apparatus outputs light toward the fourth surface, and the second light source apparatus outputs light toward the first surface.

4. The projector according to claim 2,
wherein the exterior enclosure further has a fourth surface that extends along the first surface of the exterior enclosure and faces the first surface,
the light source apparatus includes a first light source apparatus so provided as to face the first surface and a second light source apparatus so provided as to face the fourth surface, and
the first light source apparatus outputs light toward the fourth surface, and the second light source apparatus outputs light toward the first surface.

5. The projector according to claim 3, further comprising a fan that produces an air flow that cools the heat dissipation fin.

6. The projector according to claim 4, further comprising a fan that produces an air flow that cools the heat dissipation fin.

7. The projector according to claim 5, wherein a rotary shaft of the fan extends along the first surface of the exterior enclosure.

8. The projector according to claim 6, wherein a rotary shaft of the fan extends along the first surface of the exterior enclosure.

9. The projector according to claim 5, wherein the second substrate surface of the substrate intersects the first surface of the exterior enclosure.

10. The projector according to claim 6, wherein the second substrate surface of the substrate intersects the first surface of the exterior enclosure.

11. The projector according to claim 7, wherein the second substrate surface of the substrate intersects the first surface of the exterior enclosure.

12. The projector according to claim 8, wherein the second substrate surface of the substrate intersects the first surface of the exterior enclosure.

13. The projector according to claim 9, wherein a dimension of the heat dissipation fin in a widthwise direction in a downstream portion of the air flow is greater than a dimension of the heat dissipation fin in the widthwise direction in an upstream portion of the air flow.

14. The projector according to claim 10, wherein a dimension of the heat dissipation fin in a widthwise direction in a downstream portion of the air flow is greater than a dimension of the heat dissipation fin in the widthwise direction in an upstream portion of the air flow.

15. The projector according to claim 11, wherein a dimension of the heat dissipation fin in a widthwise direction in a downstream portion of the air flow is greater than a dimension of the heat dissipation fin in the widthwise direction in an upstream portion of the air flow.

16. The projector according to claim 12, wherein a dimension of the heat dissipation fin in a widthwise direction in a downstream portion of the air flow is greater than a dimension of the heat dissipation fin in the widthwise direction in an upstream portion of the air flow.

\* \* \* \* \*